(12) United States Patent
Sharma et al.

(10) Patent No.: US 8,923,160 B2
(45) Date of Patent: Dec. 30, 2014

(54) MECHANISM FOR CHANNEL SYNCHRONIZATION

(71) Applicant: Cisco Technology, Inc., San Jose, CA (US)

(72) Inventors: Neil Sharma, Ithaca, NY (US); Matthew Todd Lawson, Grass Valley, CA (US); Mick R. Jacobs, Auburn, CA (US)

(73) Assignee: Cisco Technology, Inc., San Jose, CA (US)

( * ) Notice: Subject to any disclaimer, the term of this patent is extended or adjusted under 35 U.S.C. 154(b) by 103 days.

(21) Appl. No.: 13/690,560

(22) Filed: Nov. 30, 2012

(65) Prior Publication Data

US 2013/0089110 A1 Apr. 11, 2013

Related U.S. Application Data

(63) Continuation of application No. 11/701,690, filed on Feb. 2, 2007, now Pat. No. 8,331,405.

(51) Int. Cl.
*H04L 12/28* (2006.01)
*H04J 3/06* (2006.01)
*H03K 5/135* (2006.01)
*H03M 5/04* (2006.01)
*H03M 7/20* (2006.01)
*H03M 9/00* (2006.01)
*H04L 25/02* (2006.01)

(52) U.S. Cl.
CPC .............. *H04J 3/0635* (2013.01); *H03K 5/135* (2013.01); *H03M 5/04* (2013.01); *H03M 7/20* (2013.01); *H03M 9/00* (2013.01); *H04J 3/0602* (2013.01); *H04J 3/0685* (2013.01); *H04L 25/0264* (2013.01)
USPC ........................................................ 370/254

(58) Field of Classification Search
USPC ......................................... 370/503; 714/807
See application file for complete search history.

(56) References Cited

U.S. PATENT DOCUMENTS 6,321,361 B1* 11/2001 Autechaud et al. ........... 714/807
2005/0154956 A1* 7/2005 Lesartre ........................ 714/752
2007/0008991 A1* 1/2007 Sridharan et al. ............. 370/474

\* cited by examiner

*Primary Examiner* — Wei Zhao
(74) *Attorney, Agent, or Firm* — Campbell Stephenson LLP

(57) ABSTRACT

A channel synchronization method in which local serializers serially transmits first n-bit codes, respectively, to remote deserializers, respectively. Also local deserializers serially receive first n-bit codes, respectively, from remote serializers, respectively. One of the first n-bit codes transmitted to one of the remote serializers indicates one of the local deserializers is not link aligned.

18 Claims, 6 Drawing Sheets

the ASIC receiving data
MECHANISM FOR CHANNEL SYNCHRONIZATION

CROSS-REFERENCE TO RELATED APPLICATIONS

This application is a continuation of U.S. patent application Ser. No. 11/701,690, entitled "Mechanism For Channel Synchronization" filed Feb. 2, 2007, and naming Neil Sharma, Matthew Todd Lawson, Mick R. Jacobs as the inventors. This application is assigned to Cisco Technology, Inc., the assignee of the present invention, and is hereby incorporated by reference in its entirety and for all purposes as if completely and fully set forth herein.

BACKGROUND

Communication channels are employed in many types of communication systems. Communication channels transmit data between, for example, a line card and a switching fabric of a switch or a router.

BRIEF DESCRIPTION OF THE DRAWINGS

A better understanding of the present invention can be obtained when the following detailed description of the drawings is considered in conjunction with the following drawings.

The use of the same reference symbols in different drawings indicates similar or identical items.

DETAILED DESCRIPTION

The following is intended to provide a detailed description of one or more examples of the invention and should not be taken to be limiting of the invention itself. Rather, any number of variations may fall within the scope of the invention which is defined in the claims following the description. In the following description, the present invention could be implemented as hardware although one of ordinary skill will readily recognize that the equivalent of such hardware may also be constructed in a computer program executing on one or more processors. If the invention is implemented as a computer program, the program may be stored in a conventional computer readable medium that may include, for example: magnetic storage media such as a magnetic disk (e.g., a floppy disk or a disk drive), or magnetic tape; optical storage media such as an optical disk, optical tape, or machine readable barcode; solid state electronic storage devices such as random access memory (RAM), or read-only memory (ROM); or any other device or medium employed to store computer program instructions.

Figure 1:
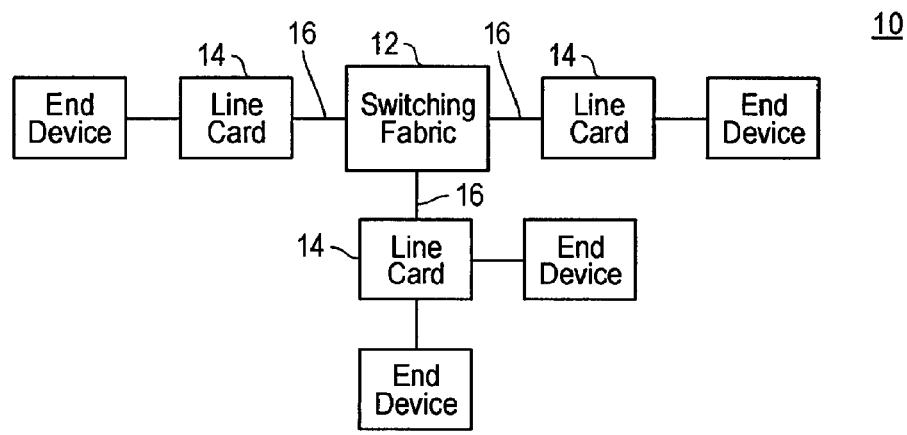
FIG. 1 illustrates relevant components of an exemplary communication system.

FIG. 1 illustrates a block diagram showing relevant components of an example communication system 10, which includes a switching fabric 12 coupled to multiple line cards via respective communication channels 16. The switching fabric 12 may include ports (not shown in FIG. 1) which are coupled to respective communication channels. The line cards, in turn, may be coupled to one or more end-devices. The term end-device may be defined to include desk top computers, printers, servers, disk arrays, switches, routers, or other such components.

Communication system 10 enables transmission of data between the various end-devices coupled to line cards 14. While the present invention will be described with reference to transmitting data between end-devices via a switching fabric, the present invention should not be limited thereto. The present invention may find application in transmitting data directly between a first device (e.g., a disk array) and a second device (e.g., a server) via a communication channel.

Figure 2:
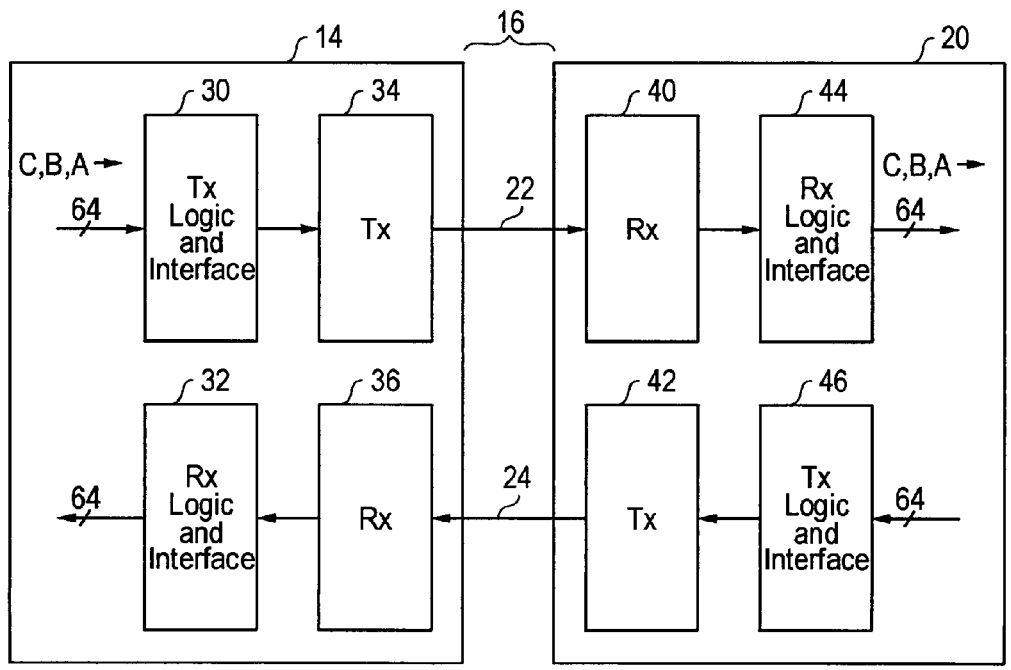
FIG. 2 illustrates relevant components of one of the line cards and a switching fabric port of FIG. 1.

FIG. 2 illustrates relevant components of one of the line cards 14 of FIG. 1. FIG. 1 also shows relevant components of a switching fabric port 20 of switching fabric 12 also of FIG. 1. Communication channel 16 includes unidirectional channel 22 for transmitting data from line card 14 to fabric port 20, and unidirectional channel 24 for transmitting data from fabric port 20 to line card 14. As will be more fully described below, each of the channels 22 and 24 includes n serial links, and each serial link may take form in a pair of differential lines. The present invention will be described with each of the channels 22 and 24 including 8 serial links, it being understood that the present invention should not be limited thereto.

Line card 14 includes a transmit logic and interface module (TLIM) 30 coupled to a transmitter 34, and a RLIM (RLIM) 32 coupled to a receiver 36. Although not shown, line card 14 may include a host ASIC coupled to the TLIM 30 and the RLIM 32. Fabric port 20 includes a RLIM 44 coupled to a receiver 40, and a TLIM 46 coupled to a transmitter 42. Transmitters 34 and 42 may be identical to each other, and receivers 36 and 40 may be identical to each other. Moreover, TLIMs 30 and 46 may be identical to each other, and RLIMs 32 and 44 may be identical to each other.

The end-devices of FIG. 1 can communicate with each other by sending data in accordance with any one of several well known protocols. The line card and fabric port shown in FIG. 2 will be described with reference to transmission of data from line card 14 to switching port 20. Data from an end-device enters line card 14 and is subsequently transmitted to fabric port 20 via transmit channel 22. It should be understood that the principals described with respect to transmission of data via transmit channel 22, apply equally to the transmission of data from fabric port 20 to line card 14 via receive channel 24.

The combination of TLIM 30, transmitter 34, channel 22, receiver 40, and RLIM 44 defines a communication path through which data is transmitted from line card 14 to fabric port 20. In operation, TLIM 30 receives 64-bit wide data values from the line card's host ASIC (not shown) via a 64-bit wide parallel bus in response to the host ASIC receiving data packets or frames from an end-device coupled thereto. FIG. 2 shows TLIM 30 receiving 64-bit wide data values A-C in sequential order. If the communication path consisting of TLIM 30, transmitter 34, channel 22, receiver 40, and RLIM 44 is operating properly, RLIM 44 will subsequently output the 64-bit wide data values A-C in sequential order onto a 64-bit wide parallel bus as shown. However, as will be more fully described below, if the communication path components are not operating properly, the 64-bit wide data values A-C received by TLIM 30 will not emerge in order from RLIM 44. For example, if receiver 40 is not link and/or channel aligned, then the 64-bit wide data values A-C will not emerge from RLIM 44; rather, RLIM will output invalid 64-bit wide data values. The present invention will be described with reference to transmitting 64-bit wide data values A-C, but the present invention should not be limited thereto. The present invention may find application to transmitting data values having fewer bits (e.g. 32-bits) or more data bits (e.g. 128-bits) through the communication path consisting of TLIM 30, transmitter 34, channel 22, receiver 40, and RILM 44.

Figure 3:
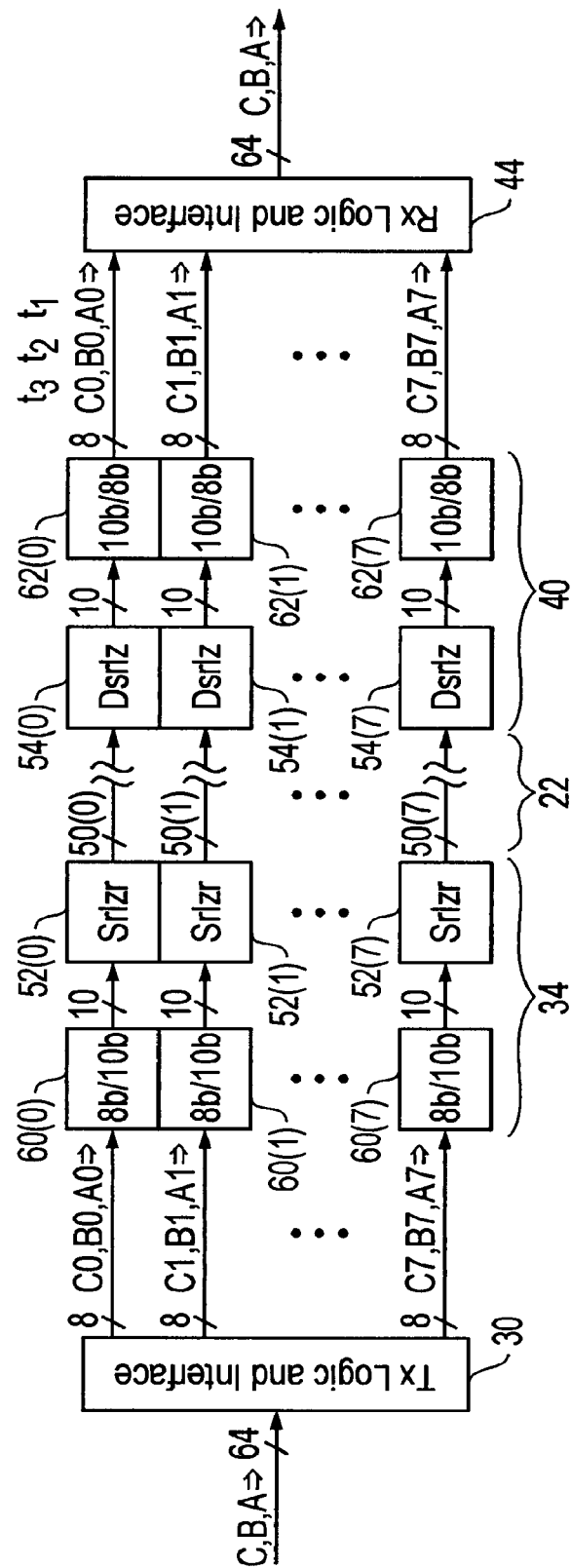
FIG. 3 illustrates relevant components of one of the receivers and one of the transmitters of FIG. 2.

FIG. 3 illustrates relevant components of the transmitter 34 and receiver 40 in block diagram form. FIG. 3 also shows channel 22 of FIG. 2, which consists of 8 serial links 50. In one embodiment, each link 50 consists of a pair of differential lines for serially transmitting data as will be more fully described below. Transmitter 34 consists of eight serializers 52 coupled to eight 8-bit/10-bit encoders 60 via respective 10-bit wide parallel buses. Receiver 40 includes eight deserializers 54 coupled to eight 10-bit/8-bit decoders 62 via respective 10-bit wide parallel buses. The 8-bit/10-bit encoders 60 are coupled to respective outputs of the TLIM 30 via 8-bit wide parallel data buses as shown. Similarly, the outputs of the 10-bit/8-bit decoders 62 are coupled to respective inputs of the RLIM 44 via 8-bit wide parallel buses as shown. The relevant purposes and functions of the various components of transmitter 34 and receiver 40 shown in FIG. 3 will be described below.

FIG. 3 shows TLIM 30 sequentially receiving three 64-bit wide data values A-C from the host ASIC (not shown) via a 64-bit wide parallel bus. TLIM 30 divides the 64-bit wide data values into 8 bytes (A0-A7), which in turn are outputted at the same time and subsequently transmitted to the eight encoders 60 via respective 8-bit wide parallel buses. TLIM 30 then receives the next 64-bit wide data value B. TLIM 30 divides B into eight bytes (B0-B7), which in turn are transmitted to respective encoders 60. Lastly, TLIM 30 receives 64-bit wide data value C. TLIM 30 divides C into eight bytes (C0-C7), which in turn are transmitted at the same time to respective encoders 60. FIG. 3 illustrates bytes of each 64-bit value being transmitted across the 8-bit wide buses between the TLIM 30 and encoders 60.

As noted above, channel 22 consists of eight links, each of which includes a pair of differential lines for serially transmitting data bits from a serializer 50 to a respective deserializer 54. Each of the serial links 50 are subject to run length and/or DC imbalance problems described in U.S. patent application Ser. No. 11/364,303 (the 303 Application), entitled FABRIC CHANNEL CONTROL APPARATUS AND METHOD, which was filed Feb. 28, 2006, and which is incorporated herein by reference in its entirety. These run length and/or DC imbalance problems can arise when too many bits of the same value (e.g., logical 1 or logical 0) are consecutively transmitted across a serial link. The 8-bit/10-bit encoders 60 prevent these run length and/or DC imbalance problems as described in the 303 Application. In operation, each 8-bit/10-bit encoders maps each 8-bit value into a corresponding 10-bit code, which in turn is subsequently transmitted to a respective serializer 52 via a 10-bit wide parallel data bus coupled therebetween. The serializer 52, in turn, serially transmits each bit of the 10-bit code to its respective deserializer 54 via a serial link 50. Deserializer 54, in response to serially receiving the 10 bits of the 10-bit code, aggregates the 10 bits to recreate the 10-bit code, which in turn is sent to its respective 10-bit/8-bit decoder 62 via a 10-bit wide parallel data bus coupled therebetween. Decoder 62 decodes the 10-bit code into the corresponding 8-bit value, which in turn is sent in parallel to a respective input of RLIM 44 via an 8-bit wide parallel data bus.

If the deserializers 54 are operating properly (e.g., operating in link and channel alignment), the eight bytes of a 64-bit wide data value inputted to respective 8-bit/10-bit encoders 60 on the line card side, will subsequently emerge in parallel (i.e., at the same time with respect to each other) from respective 10-bit/8-bit decoders 62 on the fabric port side. FIG. 3 illustrates that deserializers are operating in link and channel alignment. More particularly, FIG. 3 shows that bytes A0-A7 of data value A inputted at the same time to respective encoders 60, subsequently emerge in parallel from respective 10-bit/8-bit decoders 62 at time $t_1$. FIG. 3 also shows bytes B0-B7 of data value B emerging from the 10-bit/8-bit decoders 62 in parallel at the same time $t_2$ just after bytes A0-A7 emerge in parallel from respective 10-bit/8-bit decoders. Likewise, FIG. 3 shows bytes C0-C7 of data value C emerging in parallel at the same time $t_3$ from respective 10-bit/8-bit decoders 62. Because deserializers are link and channel aligned, RLIM 44 recombines the outputs of the 10-bit/8-bit decoders 62 and sequentially transmits data values A-C onto the 64-bit wide parallel bus coupled thereto. However, RLIM 64 will output 64-bit wide invalid data if one or more of the deserializers 54 are not link aligned and/or if one or more of the deserializers 54 are not channel aligned with the remaining deserializers 54 as will be more fully described below.

Figure 4:
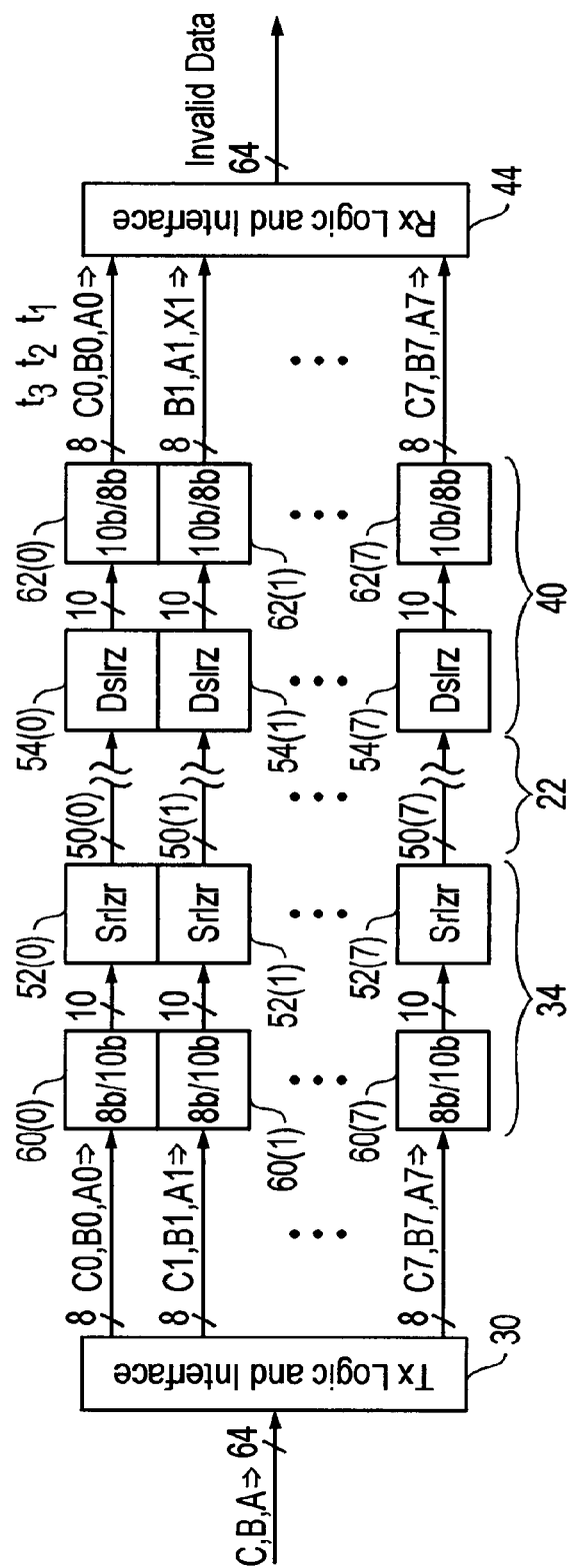
FIG. 4 illustrates relevant components and operational aspects of one of the receivers and one of the transmitters of FIG. 2.

FIG. 4 illustrates the effects of a lack of channel alignment between deserializers 54 of FIG. 3. FIG. 4 shows the same sequential input of 64-bit wide data values A-C to TLIM 30. For purposes of explanation, it will be presumed the 8-bit/10-bit encoders 60 and the serializers 52 operate as described with reference to FIG. 3. Moreover, deserializers 54 will be presumed to be link aligned. However, deserializer 54(1) is presumed to be operating out of channel alignment. In general, channel alignment can mean that deserializers 54 output corresponding 10-bit codes in parallel or at the same time. For purposes of explanation only, channel misalignment will take form in deserializer 54(1) outputting its 10-bit code by one clock cycle after the remaining deserializers 54 output their respective and corresponding 10-bit codes. It should be understood that the term channel misalignment should not be limited to that shown in FIG. 4. Rather, channel misalignment may take form in a deserializer 54 outputting its 10-bit code one clock cycle before the remaining deserializers output their respective and corresponding 10-bit codes. Further, channel misalignment may take form in two or more of the deserializers 54 outputting their 10-bit codes at the same time, but one clock cycle before or after the remaining deserializers 54 output their respective and corresponding 10-bit codes.

As noted, FIG. 4 illustrates the effect of channel misalignment of deserializer 54(1). Specifically, FIG. 4 shows that byte B1 of B is outputted from decoder 62(1) at the same time $t_3$ that byte C0 and bytes C2-C7 are outputted from decoders 62(0) and 62(2)-62(7), respectively. FIG. 4 also shows that byte A1 of A is outputted from decoder 62(1) at the same time $t_2$ that byte B0 and bytes B2-B7 are outputted from decoders 62(0) and 62(2)-62(7), respectively. Lastly, byte X1 of a 64-bit wide data value X (not shown) inputted to the TLIM 30 prior to 64-bit wide data value A, is outputted from decoder 62(1) at the same time $t_1$ as byte A0 and bytes A2-A7 are outputted from decoders 62(0) and 62(2)-62(7), respectively. Bytes A0, X, and A2-A7 are received in parallel and combined by RLIM 44 to produce a 64-bit wide invalid data value. Likewise, bytes B0, A1, and B1-B7, outputted at the same time by decoders 62, respectively, are subsequently received in parallel and combined by RUM 44 to produce a 64-bit wide invalid data value.

Figure 5:
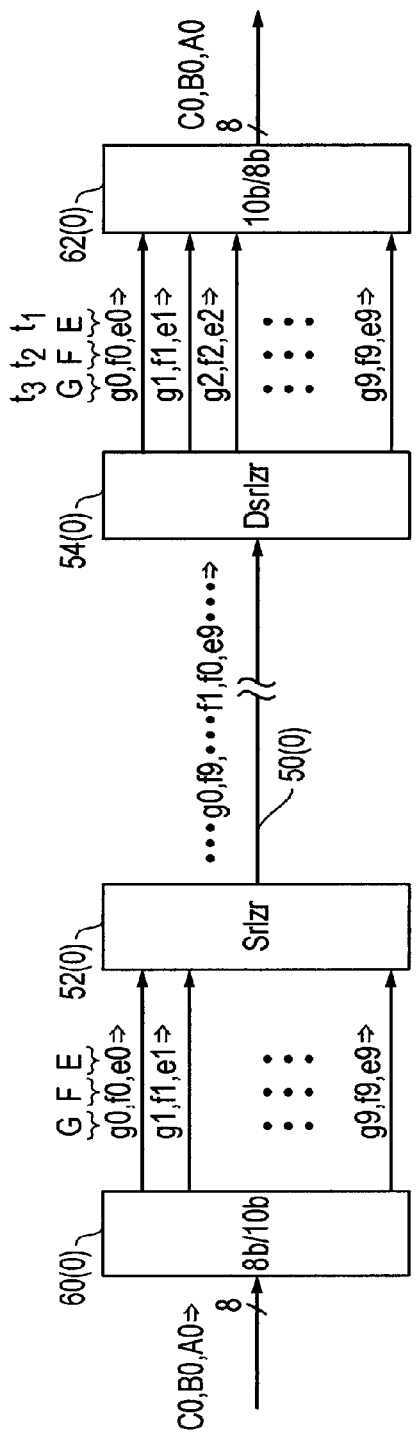
FIG. 5 illustrates relevant operational aspects of an encoder, a serializer, a deserializer and a decoder of FIG. 3 or FIG. 4.
Figure 6:
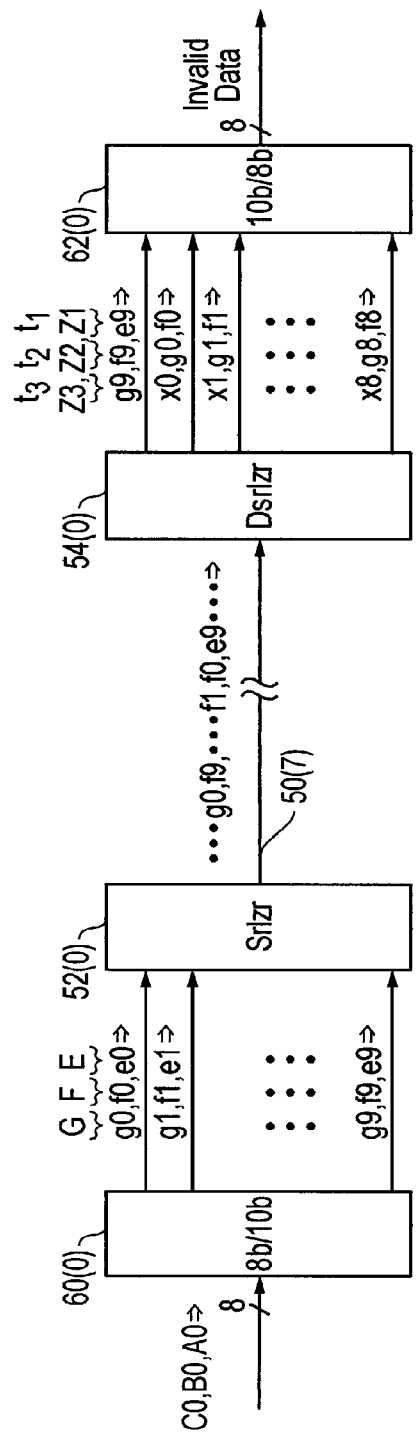
FIG. 6 illustrates relevant operational aspects of an encoder, a serializer, a deserializer and a decoder of FIG. 3 or FIG. 4.

As noted above, link misalignment can also cause improper function of the communication path shown in FIG. 3. FIGS. 5 and 6 illustrate aspects of deserializer link alignment and misalignment, respectively. FIGS. 5 and 6 illustrate encoder 60(0), serializer 52(0), deserializer 54(0), and decoder 62(0) of FIG. 3 in greater detail. FIG. 5 shows that bytes A0-C0 are sequentially inputted into encoder 60(0) as described above. Encoder 60 translates bytes A0-C0 into respective 10-bit codes G-E; 10-bit code E consists of bits e0-e9, 10-bit code F consists of bits f0-f9, and 10-bit code G consists of bits g0-g9. The 10-bit codes E-F are transmitted in sequence to serializer 52(0) over the 10-bit wide parallel bus therebetween as shown. Serializer 52(0), in response, serially transmits bits e0-e9 to deserializer 54 via serial link 50 in response to receiving 10-bit code E. Just after bit e9 is transmitted, serializer 52(0) serially transmits bits f0-f9 to deserializer 54 via serial link 50. Just after bit f9 is transmitted, serializer 52(0) serially transmits bits g0-g9 to deserializer 54 via serial link 50. FIG. 5 shows the bits of codes E-F as they are transmitted in order across link 50(0) to deserializer 54(0). Because deserializer 54(0) is link aligned, deserializer 54 outputs the 10-bit codes E-F in the same manner in which codes E-F were inputted to serializer 52(0). Thus, FIG. 5 shows that bits e0-e9 of 10-bit code E are outputted in parallel by deserializer 54(0) at time $t_1$ and transmitted to decoder 62(0) via the 10-bit wide parallel bus therebetween. Subsequently, deserializer transmits bits f0-f9 of 10-bit code F in parallel at time $t_2$ to decoder 62(0) via the 10-bit wide parallel bus therebetween. Lastly, bits g0-g9 of 10-bit code G are outputted in parallel at time $t_3$ by deserializer 54(0) and transmitted to decoder 62(0). Encoder 62, in turn, decodes the 10-bit codes E-F into bytes A0-C0, respectively, as they are received.

However, when deserializer 54(0) is out of link alignment, deserializer 54(0) may aggregate bits of two 10-bit codes it serially receives via link 50(0) and, accordingly, output erroneous 10-bit values onto the bus coupled to decoder 62(0). FIG. 6 illustrates operational aspects of deserializer 54(0) when it is operating in link misalignment in one embodiment. In FIG. 6 the same serial stream of bits is transmitted to deserializer 54(0). Because deserializer 54(0) is out of link alignment, the deserializer 54(0) outputs 10-bit values Z1-Z3 in parallel, which are not the same as the 10-bit codes E-F outputted by deserializer 54(0) in FIG. 5. Rather, 10-bit values Z1-Z3 are a mixture of bits of 10-bit codes G-F. For example, value Z1 consists of bit e9 of 10-bit code E and bits f0-f8 of 10-bit code F. The 10-bit values Z1-Z3 outputted by deserializer are transmitted in sequential order to decoder 62(0) and subsequently translated into 8-bit values which do not equate with A0-C), respectively. Rather, decoder 62(0) translates 10-bit values Z1-Z3 into 8-bit invalid data values, which are subsequently sent to RLIM 44 (not shown in FIG. 6).

The 64-bit data values outputted from RLIM 44 will be invalid if any of the deserializers 54 are channel misaligned and/or if any of the deserializers 54 are link misaligned. Channel or link misalignments can be detected. When detected, TLIM 30 is directed to enter an alignment mode in which it periodically (e.g., between 64-bit wide data values of data packets sequentially received by TLIM 30) transmits special 8-bit codes called K28.5 comma characters in parallel to each of the encoders 60. The encoders map the comma characters to corresponding 10-bit codes, which in turn are subsequently transmitted to deserializers 54. Each of the deserializers 54 may include an alignment circuit that is always active and searching for the 10-bit code corresponding to the comma character. The alignment circuits use the 10-bit codes corresponding to the comma characters to align themselves either at the link level or at the channel level. This alignment circuit will reframe the 10-bit codes corresponding to the comma character if the 10-bit code is detected out of alignment, either at the link level or at the channel level. Unfortunately, when one or more of the deserializers 54 enter a misalignment state, either at the link level or the channel level, RLIM 44 will output invalid data until link and/or channel alignment is obtained.

Figure 7:
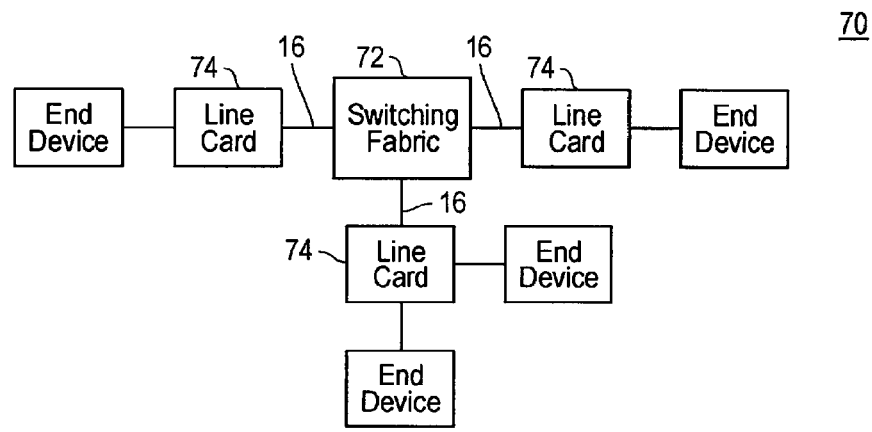
FIG. 7 illustrates relevant components of another exemplary communication system.

FIG. 7 illustrates an alternative communication 70. This communication system is similar to communication system 10 shown in FIG. 1, but with switching fabric 12 replaced by switching fabric 72, and line cards 14 replaced by line cards 74. The end-devices are the same between FIGS. 1 and 7 as are channels 16.

Figure 8:
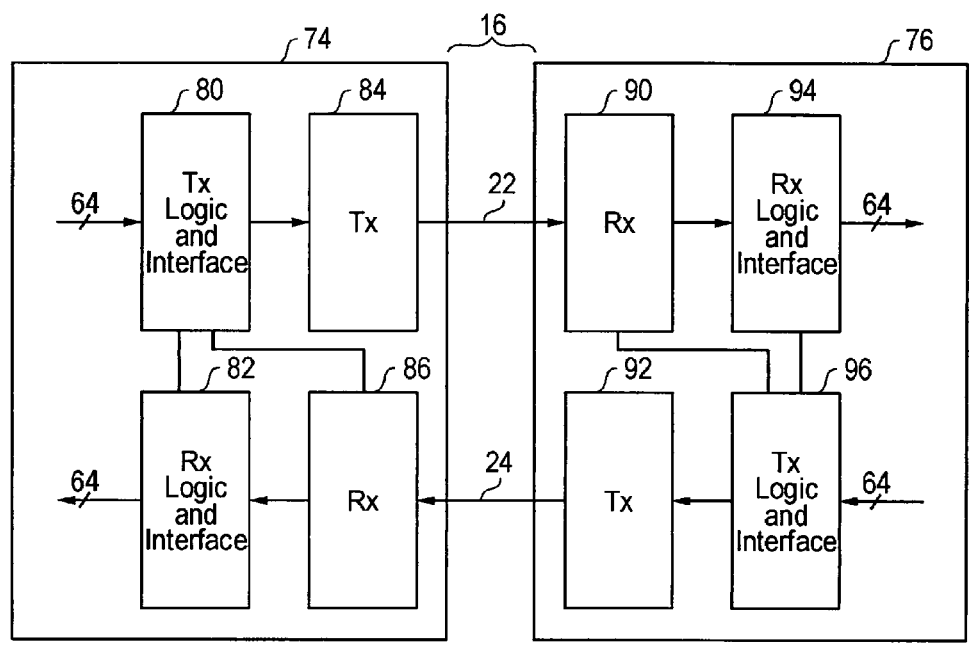
FIG. 8 illustrates relevant components of one of the line cards and a switching fabric port of FIG. 7.

FIG. 8 illustrates in block diagram form, relevant components of one of the line cards 74 shown in FIG. 7 and relevant components of a switching fabric port 76 of switching fabric 72. More particularly, line card 74 shown in FIG. 8 includes a TLIM 80 coupled to a transmitter 84, and a RLIM 82 coupled to a receiver 86. Fabric port 76 includes a receiver 90 coupled to RLIM 94, and a transmitter 92 coupled to TLIM 96. Transmitter 84 and receiver 90 are coupled to each other via the same type of transmit channel 22 shown in FIG. 2. Likewise, transmitter 92 is coupled to receiver 86 via the same type of receive channel 24 shown in FIG. 2.

Like TLIM 30 shown in FIG. 2, TLIM 80 sequentially receives 64-bit wide data values from a host ASIC (not shown) via a 64-bit wide data bus for subsequent transmission to switch fabric 72 via the transmit communication path, which includes transmitter 84, transmit channel 22, receiver 90, and RLIM 94. RLIM 94 sequentially outputs the same 64-bit wide data values onto a 64-bit wide parallel data bus coupled to it if the transmit communication path is operating properly. Similarly, TLIM 96 of port 76 sequentially receives 64-bit wide data values via a 64-bit wide data bus for subsequent transmission to an end-device (not shown) coupled to line card 74 via the communication path that includes transmitter 92, receive channel 24, receiver 86, and RLIM 82. RLIM 82 sequentially outputs the same 64-bit wide data values onto a 64-bit wide parallel data bus coupled to it if the receive communication path is operating properly. Like RLIM 44 described above, neither RLIM 82 nor 94 will output valid 64-bit wide data values onto their respective 64-bit wide buses if deserializers contained in the receive and transmit communication paths, respectively, are link and/or channel aligned.

The 303 Application describes a protocol for data communication between line cards and a switching fabric. Line cards employing the 303 Application protocol do not use 8-bit/10-bit encoders or 10-bit/8-bit decoders to prevent run length and DC bias problems created by the serial links described above. Moreover, the 303 Application protocol does not use K28.5 comma characters for channel and/or link alignment operations. However, as more fully described below, deserializers contained within receiver 86 and/or 90 are capable of realigning themselves either on the link level or at the channel level. In one embodiment of the present invention, TLIM 80 can transmit local channel alignment status information of receiver 82, and TLIM 96 can transmit local channel alignment status information of receiver 94. As will be more fully described below, TLIM 80 can generate alignment codes based upon the alignment status of receiver 86 and/or receiver 90, and TLIM 96 can generate alignment codes based upon the alignment status of receiver 90 and/or receiver 86.

Figure 9:
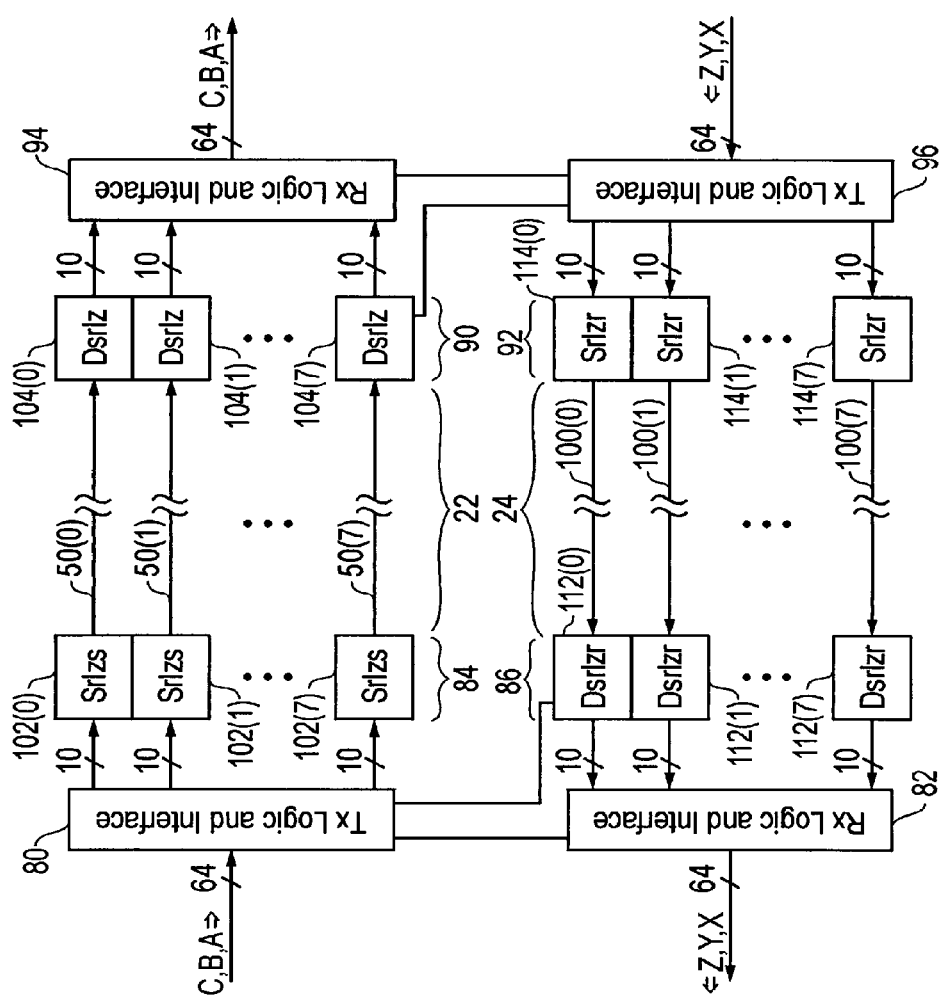
FIG. 9 illustrates relevant components of the receivers and the transmitters of FIG. 8.

FIG. 9 illustrates components of FIG. 8 in greater detail. Specifically, FIG. 9 shows transmitter 84 containing serializers 102, and transmitter 92 containing serializers 114. FIG. 9 also shows receiver 86 containing deserializers 112, and receiver 90 containing deserializers 104. The serializers of FIG. 9 operate in a manner that is the same or similar to the operation of serializers 52 described above. The deserializers of FIG. 9 operate in a manner that is the same or similar to the operation of deserializers 54 described above. Transmitters 84 and 92 or receivers 86 and 90 may include integrated circuit components other than that shown in FIG. 9.

Deserializers 104 and 112 may include link level alignment logic for aligning the deserializers on the link level should they enter a state of link level misalignment. Deserializers 104 and 112 may also include channel level alignment logic, which collectively align the deserializers on the channel level should they enter a state of channel level misalignment. Alternatively, the link level and channel level alignment logic may take form in integrated circuits that are external to the deserializers 104 and 112, but which operate on the outputs of the deserializers 104 and 112 and provide link level and/or channel level alignment. In this alternative embodiment, the outputs of deserializers 104 can be coupled to respective inputs of link level alignment logic circuits (not shown) via respective 10-bit wide parallel buses (not shown), the outputs of the link level alignment logic circuits can be coupled to respective inputs of the channel level alignment logic circuits (not shown) via respective 10-bit wide parallel buses (not shown), and the outputs of the channel level alignment logic circuits can be coupled to respective inputs of the RLIM 94 via respective 10-bit wide parallel buses. On the line card side the outputs of deserializers 112 can be coupled to respective inputs of link level alignment logic circuits (not shown) via respective 10-bit wide parallel buses (not shown), the outputs of the link level alignment logic circuits can be coupled to respective inputs of the channel level alignment logic circuits (not shown) via respective 10-bit wide parallel buses (not shown), and the outputs of the channel level alignment logic circuits can be coupled to respective inputs of the RLIM 82 via respective 10-bit wide parallel buses. The link level and/or channel level alignment logic, whether contained in the deserializers 112 or configured as separate integrated circuits in the data path between the deserializers 112 and the RLIM 82, may be in data communication with TLIM 80, which enables the link level and/or channel level alignment logic to report alignment status (i.e., aligned or misaligned on the channel and/or link level) as will be more fully described below. Similarly, the link level and/or channel level alignment logic, whether contained in the deserializers 104 or configured as separate integrated circuits in the data path between the deserializers 104 and the RLIM 94, may be in data communication with TLIM 96, which enables the link level and/or channel level alignment logic to report alignment status (i.e., aligned or misaligned on the channel and/or link level) as will be more fully described below. The deserializers 104 and 112 can also report to TLIM 96 and TLIM 80, respectively, the types of 10-bit alignment codes deserializers 104 and 112 receive from their respective serializers 102 and 92 as will be more fully described below.

In operation, TLIM 80 sequentially receives 64-bit wide data values (e.g., A-C) of, for example, a data packet via the 64-bit wide data bus coupled to a host ASIC (not shown). TLIM 80 may operate in accordance with the protocol described in the 303 Application. In particular, when TLIM 80 receives the three 64-bit wide data values (e.g., A-C), TLIM 80 generates a frame. The frame may consist of a header (more fully described in the 303 Application) and the contents of the three 64-bit wide data values (e.g., A-C).

TLIM 80 outputs eight 10-bit portions of the frame in parallel for subsequent transmission to respective serializers 102 via the 10-bit wide parallel buses, respectively shown in FIG. 9. After the first eight 10-bit portions of the frame are transmitted to respective serializers, the next eight 10-bit portions of the frame are transmitted. The third eight 10-bit frame portions outputted in parallel by TLIM 80 may contain data from the next frame generated by TLIM 80.

Serializers 102, in turn, transmit the respective 10-bit frame portions they receive from TLIM 80 in serial fashion to respective deserializers 104 via respective serial links 50. If deserializers 104 are in link and channel alignment, deserializers 104 will output in parallel the same 10-bit frame portions that were respectively received in parallel by the serializers 102. The eight 10-bit frame portions respectively outputted by deserializers 104 are transmitted to RLIM 94 via respective 10-bit wide parallel buses coupled therebetween.

RLIM 94 may process the 10-bit frame portions it receives to recreate the frames. RLIM 94 may then process the frames or frames it recreates in accordance with the protocol of the 303 Application in order to generate the original 64-bit wide data values A-C. Eventually, RLIM 94 sequentially outputs A-C onto the 64-bit wide parallel data bus coupled thereto. The receive communication path including TLIM 96, serializers 114, receive channels 100, deserializers 112, and RLIM 82 operate in substantially the same way as the transmit communication path including TLIM 80, serializers 102, transmit channels 50, deserializers 104, and RLIM 94 described above. Thus, if the transmit communication path is operating properly, 64-bit wide data values Z-X sequentially inputted to TLIM 96, will eventually emerge from RLIM 82 as shown.

Deserializers 104 and 112 include link alignment and channel alignment logic, for initial aligning or for realigning the deserializers on the link level and/or channel level as noted above. An initial link and/or channel alignment may need to occur when components shown in FIG. 9 are first powered up or rebooted, while realignment may need to occur when one or more of the deserializers are discovered to be operating out of alignment either on a link level an/or a channel level basis. For purposes of explanation, the present invention will be described below with respect to realigning the deserializers after one or more are discovered to be operating out of alignment on both the link level and channel level, it being understood that the present invention should not be limited thereto. In contrast to the system described in FIGS. 3 and 4, TLIM 80 may suspend the transmission of 64-bit wide data received from the host ASIC until deserializers 104 are realigned on the link and/or channel level, or TLIM 80 may suspend the transmission of 64-bit wide data values received from the host ASIC until deserializers 104 and 112 are realigned on the link and/or channel level. TLIM 96 may also suspend the transmission of 64-bit wide data it receives under the same circumstances.

When it is discovered that one or more of the deserializers 104 or 112 are out of alignment, TLIM 80 and TLIM 96 output a first 10-bit alignment code for subsequent transmission to each of the serializers 102 and 114, respectively. TLIM 80 transmits the first 10-bit alignment code in parallel (i.e., at the same time) to each of the serializers 102, and TLIM 96 transmits the same first 10-bit alignment code in parallel to each of the serializers 114. The first 10-bit code indicates that local deserializers are out of link alignment (deserializers 112 are local to TLIM 80 while deserializers 104 are local to TLIM 96). Thus, the first 10-bit alignment code transmitted to serializer 102 indicates that one or more deserializers 112 are out of link alignment. Likewise, the first 10-bit alignment code transmitted in parallel (i.e., at the same time) to serializer 114 indicates that one or more deserializers 104 are out of link alignment. For purposes of explanation, it will be presumed that only one of the deserializers 104 is out of link level alignment when the first 10-bit alignment codes are transmitted to serializers 102 and 114. In one embodiment, the first 10-bit alignment code may take form as "1010100011," where the least significant bits "011" are the active part of the 10-bit alignment code that defines the status of the local deserializers as out of link alignment.

TLIM 80 will continue to send the first 10-bit alignment codes in parallel to respective serializers 102 for subsequent transmission to deserializers 104, respectively, until TLIM 80 receives an indication from deserializers 112 that each is link level aligned. It is noted TLIM 80 may send one or more 10-bit values in between successive transmissions of the first 10-bit alignment codes. Similarly, TLIM 96 will continue to send the first 10-bit alignment codes in parallel to serializers 114 for subsequent transmission to deserializers 112, respectively, until TLIM 96 is notified that each of the deserializers 104 are in link level alignment.

The link level alignment logic (not shown) of deserializers 104 can use the first 10-bit alignment codes received from respective serializers 102 to align deserializers 104 on the link level. Once a deserializer 104 is aligned on the link level, the deserializer will send TLIM 96 a signal indicative thereof via the connection shown in FIG. 9. Although FIG. 9 only shows one connection between deserializer 104(7) and TLIM 96, it is presumed that each of the deserializers 104 has a connection to TLIM 96 over which it can transmit their link level alignment status. Similarly, the link level alignment logic (not shown) of deserializers 112 use the first 10-bit alignment codes received from respective serializers 114 to align deserializers 112 on the link level. Once a deserializer 112 is link aligned, the deserializer will send TLIM 80 a signal indicative thereof via the connection shown in FIG. 9. Although FIG. 9 only shows one connection between deserializer 112(0) and TLIM 80, it is presumed that each of the deserializers 112 has a connection to TLIM 80 over which it can transmit their link level alignment status.

When TLIM 96 receives verification that each of the deserializers 104 is in link level alignment, TLIM 96 may transmit a second 10-bit alignment code in parallel to each of the serializers 114. The second 10-bit code indicates that each of the local deserializers (i.e., deserializers 104) is link aligned. Similarly, when TLIM 80 receives verification that each of the deserializers 112 is in link level alignment, TLIM 80 will transmit the second 10-bit alignment code to each of the serializers 102. The second 10-bit code indicates that each of the local deserializers 104 is in link level alignment. In one embodiment, the second 10-bit alignment code may take form as "1010100110," where the least significant bits "110" are the active part of the second 10-bit alignment code that defines the status of the local deserializers as link aligned. Serializers 114 transmit the second 10-bit alignment code in parallel to respective deserializers 112, and serializers 102 transmit the second 10-bit alignment code in parallel to respective deserializers 104.

The link level alignment logic (not shown) of deserializers 112 can use the second 10-bit alignment code they receive, respectively, to link align themselves if not already in link alignment, and the link level alignment logic (not shown) of deserializers 104 deserializers 104 can use the second 10-bit alignment code they receive, respectively, to link align themselves if not already in link alignment. As noted above, deserializers 104 and 112 inform TLIM 96 and TLIM 80, respectively, when they are link aligned. In addition, deserializers 104 and 112 inform TLIM 96 and TLIM 80, respectively of the alignment status of deserializers 112 and 104, respectively, by virtue of the alignment codes they receive. Thus, when deserializers 104 receive second 10-bit alignment codes, deserializers 104 transmit a signal to TLIM 96 indicating that deserializers 112 are in link alignment, and when deserializers 112 receive second 10-bit alignment codes, deserializers 112 transmit a signal to TLIM 80 indicating that deserializers 104 are in link alignment. As an aside, the first and second 10-bit alignment codes are selected to insure that links 50 and 100 do not experience run length or DC balance problems. In one embodiment, the first and second 10-bit alignment codes contain an equal number or logical ones and zeros.

Once TLIM 80 is informed by local deserializers 112 that all deserializers 112 and 104 are link aligned, TLIM 80 may transmit third 10-bit alignment codes in parallel (i.e., at the same time) to respective serializers 102 Likewise, once TLIM 96 is informed by local deserializers 104 that all deserializers 104 and 112 are link aligned, TLIM 96 may transmit third 10-bit alignment codes in parallel (i.e., at the same time) to respective serializers 102. The third 10-bit alignment code indicates the local deserializers are not channel aligned. Thus, the third 10-bit alignment codes sent by TLIM 96 indicate that deserializers 104 are not in channel level alignment. Similarly, the third 10-bit code sent by TLIM 80 indicates that deserializers 112 are channel aligned. The third 10-bit alignment codes may be part of a frame generated in accordance with the protocol of the 303 Application, which frame may also include stuff code. In one embodiment, the third 10-bit alignment code may take form as "1010100100," where the least significant bits "100" are the active part of the 10-bit alignment code that defines the status of the local deserializers as out of channel alignment.

Serializers 102 serially transmit the respective third 10-bit alignment code they receive to respective deserializers 104. Channel level alignment logic of the deserializers 104, in response, channel align the deserializers 104 using the third 10-bit alignment codes they receive in accordance with well known principles. Once the deserializers 104 are in channel level alignment, a signal to that effect may be sent to TLIM 96. Likewise, serializers 114 serially transmit the respective third 10-bit alignment codes they receive to respective deserializers 112. Channel level alignment logic of the deserializers 112 use the third 10-bit alignment codes they receive to channel align the deserializers 104 in accordance with well known principles. Once the deserializers 112 are in channel level alignment, a signal to that effect may be sent to TLIM 80. Channel level alignment logic of the deserializers 104 should be able to channel align the deserializers with the first set of third 10-bit alignment codes they receive. Likewise, channel level alignment logic of the deserializers 112 should be able to channel align the deserializers with the first set of third 10-bit alignment codes they receive.

When TLIM 80 receives verification that local deserializers 112 are in channel alignment, TLIM 80 may transmit fourth 10-bit alignment codes in parallel (i.e., at the same time) to respective serializers 102. This fourth bit code indicates that local deserializers (e.g., deserializers 112) are channel aligned. Serializers 102, in response, transmit the fourth 10-bit alignment code to their respective deserializers 104. When deserializers 104 receive the fourth 10-bit codes, respectively, deserializers 104 may send a signal to TLIM 96 indicating that deserializers 112 are channel aligned. Similarly, when TLIM 96 receives verification that local deserializers 104 are in channel alignment, TLIM 96 may transmit fourth 10-bit alignment codes in parallel (i.e., at the same time) to respective serializers 114. Serializers 114, in response, transmit the fourth 10-bit alignment code to their respective deserializers 112. When deserializers 112 receive the fourth 10-bit code, the deserializers 112 may send a signal to TLIM 96 indicating that deserializers 104 are in channel alignment. The fourth 10-bit alignment codes may be part of a frame generated in accordance with the protocol of the 303 Application, which frame may also include stuff code. In one embodiment, the fourth 10-bit alignment code may take form as "1010100000," where the least significant bits "000" are the active part of the fourth 10-bit alignment code that defines the status of the local deserializers as channel aligned.

Once TLIM 96 receives confirmation that deserializers 112 are in channel level alignment via the fourth 10-bit codes received via serializers 102, TLIM 96 can exit its realignment mode of operation and resume transmitting data to RLIM 82 using, for example, the protocol described in the 303 Application, and TLIM 96 can resume transmitting data before or after TLIM 96 receives confirmation that deserializers 104 are in link and/or channel alignment. Likewise, Once TLIM 80 receives confirmation that deserializers 104 are in channel level alignment via the fourth 10-bit codes received via serializers 114, TLIM 80 can exit its realignment mode of operation and resume transmitting data to RLIM 94 using, for example, the protocol described in the 303 Application, and TLIM 80 can resume transmitting data before or after TLIM 80 receives confirmation that deserializers 112 are in link and/or channel alignment. Alternatively, and perhaps in the preferred embodiment, TLIM 96 and TLIM 80 will begin transmitting data to each other using the protocol described in the 303 Application once TLIM 96 and TLIM 80 receive confirmation that all local and remote deserializers are in channel level and/or link level alignment.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims.

What is claimed is:

1. A method comprising:
   detecting that a first n-bit value is received at a first local deserializer of a plurality of local deserializers, wherein
      the plurality of local deserializers are configured to receive first data,
      the first n-bit value is received from a first remote serializer of a plurality of remote serializers,
      the first n-bit value comprises a first n-bit code, if the plurality of remote deserializers are link aligned, and
      the first n-bit value comprises a second n-bit code, if at least one of the plurality of remote deserializers is not link aligned; and
   sending a second n-bit value from a first local serializer of a plurality of local serializers, in response to the detecting the first n-bit value, wherein
      the plurality of local serializers are configured to send second data, and
      the second n-bit value is sent to a first remote deserializer of a plurality of remote deserializers.

2. A method comprising:
   detecting that a first n-bit value is received at a first local deserializer of a plurality of local deserializers, wherein
      the plurality of local deserializers are configured to receive first data, and
      the first n-bit value is received from a first remote serializer of a plurality of remote serializers; and
   sending a second n-bit value from a first local serializer of a plurality of local serializers, in response to the detecting the first n-bit value, wherein
      the plurality of local serializers are configured to send second data,
      the second n-bit value is sent to a first remote deserializer of a plurality of remote deserializers,
      the second n-bit value comprises a first n-bit code, if the plurality of local deserializers are link aligned, and
      the second n-bit value comprises a second n-bit code, if at least one of the plurality of local deserializers is not link aligned.

3. The method of claim 1, wherein
   the first local deserializer outputs the first n-bit value in parallel when the first local deserializer is link aligned, and
   the first local deserializer does not output the first n-bit value in parallel when the first local deserializer is not link aligned.

4. The method of claim 1, further comprising:
   aligning the first local deserializer using the first n-bit value received from the first remote serializer, if the first local deserializer is not link aligned.

5. The method of claim 1, further comprising:
   aligning the first remote deserializer using the second n-bit value received from the first local serializer, if the first remote deserializer is not link aligned.

6. The method of claim 1, further comprising:
   sending a third n-bit value from the first local serializer to the first remote deserializer, in response to detecting at least one of the plurality of local deserializers is not link aligned.

7. An apparatus comprising:
   a node; and
   a line card coupled to the node, wherein the line card comprises
      a plurality of local serializers configured to serially transmit first data, respectively, to a plurality of remote deserializers,
      a plurality local deserializers configured to serially receive second data, respectively, from a plurality of remote serializers, and
      a first local deserializer of the local deserializers is configured to detect receipt of a first n-bit value from a first remote serializer of the plurality of remote deserializers, wherein
         the first n-bit value comprises a first n-bit code, if the plurality of remote deserializers are link aligned, and
         the first n-bit value comprises a second n-bit code, if at least one of the plurality of remote deserializers is not link aligned, and
      a first local serializer of the first local serializers is configured to serially transmit a second n-bit value to a first remote deserializer of the plurality of remote deserializers, in response to detection of the receipt of the first n-bit value.

8. An apparatus comprising:
   a node; and
   a line card coupled to the node, wherein the line card comprises a plurality of local serializers configured to serially transmit first data to a plurality of remote deserializers, a plurality local deserializers configured to serially receive second data from a plurality of remote serializers, wherein a first local deserializer of the local deserializers is configured to detect that a first n-bit value is received at the first local deserializer, and a first local serializer of the local serializers is configured to send a second n-bit value, in response to the detecting the first n-bit value, wherein the second n-bit value comprises a first n-bit code, if the plurality of local deserializers are link aligned, and the second n-bit value comprises a second n-bit code, if at least one of the plurality of local deserializers is not link aligned.

9. The apparatus of claim 7, wherein
the first local deserializer is configured to output the first n-bit value in parallel when the first local deserializer is link aligned, and
the first local deserializer is not configured to output the first n-bit value in parallel when the first local deserializer is not link aligned.

10. The apparatus of claim 7, wherein
the first local deserializer is configured to align itself using the first n-bit value received from the first remote serializer, if the first local deserializer is not link aligned.

11. The apparatus of claim 7, wherein
the first remote deserializer is configured to align itself using the second n-bit value received from the first local serializer, if the first remote deserializer is not link aligned.

12. The apparatus of claim 7, wherein
the first local serializer is configured to serially transmit a third n-bit value to the first remote deserializer, in response to detection that at least one of the plurality of local deserializers is not link aligned.

13. A system comprising:
a local node;
a remote node; and
a communications channel coupling the local node and the remote node, wherein
the communications channel comprises
local transmitting means configured to serially transmit first data to remote receiving means, and
local receiving means configured to serially receive second data from remote transmitting means,
the local receiving means is configured to detect receipt of a first n-bit value from the remote transmitting means, wherein the first n-bit value comprises a first n-bit code, if the plurality of remote receiving means are link aligned, and the first n-bit value comprises a second n-bit code, if at least one of the plurality of remote receiving means is not link aligned, and the local transmitting means is configured to serially transmit a second n-bit value to the remote receiving means, in response to detection of the receipt of the first n-bit value.

14. A system comprising:
a local node;
a remote node; and
a communications channel coupling the local node and the remote node, wherein
the communications channel comprises
local transmitting means configured to serially transmit first data to remote receiving means, and
local receiving means configured to serially receive second data from remote transmitting means, and
the local receiving means is configured to detect that a first n-bit value is received at the local receiving means, and
the local transmitting means is configured to send a second n-bit value from the local transmitting means, in response to the detecting the first n-bit value, wherein
the second n-bit value comprises a first n-bit code, if the local receiving means is link aligned, and
the second n-bit value comprises a second n-bit code, if the local receiving means is not link aligned.

15. The system of claim 13, wherein
the local receiving means is configured to output the first n-bit value in parallel when the local receiving means is link aligned, and
the local receiving means is not configured to output the first n-bit value in parallel when the local receiving means is not link aligned.

16. The system of claim 13, wherein
the local receiving means is configured to align itself using the first n-bit value received from the remote transmitting means, if the local receiving means is not link aligned.

17. The system of claim 13, wherein
the remote receiving means is configured to align itself using the second n-bit value received from the local transmitting means, if the remote receiving means is not link aligned.

18. The system of claim 13, wherein
the local transmitting means is configured to serially transmit a third n-bit value to the remote receiving means, in response to detection that the local receiving means is not link aligned.

* * * * *

UNITED STATES PATENT AND TRADEMARK OFFICE
CERTIFICATE OF CORRECTION

| | | |
|---|---|---|
| PATENT NO. | : 8,923,160 B2 | Page 1 of 1 |
| APPLICATION NO. | : 13/690560 | |
| DATED | : December 30, 2014 | |
| INVENTOR(S) | : Neil Sharma, Matthew Todd Lawson and Mick R. Jacobs | |

It is certified that error appears in the above-identified patent and that said Letters Patent is hereby corrected as shown below:

In the claims
Column 13
Line 48, in Claim 13, insert: -- a plurality of -- immediately after "first data to"

Signed and Sealed this
Fifth Day of April, 2016

Michelle K. Lee
*Director of the United States Patent and Trademark Office*